United States Patent
Ward et al.

(10) Patent No.: US 7,043,413 B2
(45) Date of Patent: May 9, 2006

(54) METHOD FOR MODELING AN ARBITRARY WELL PATH IN A HYDROCARBON RESERVOIR USING ADAPTIVE MESHING

(75) Inventors: Steven B. Ward, Austin, TX (US); Stephen R. Kennon, Austin, TX (US)

(73) Assignee: Object Reservoir, Inc., Austin, TX (US)

(*) Notice: Subject to any disclaimer, the term of this patent is extended or adjusted under 35 U.S.C. 154(b) by 836 days.

(21) Appl. No.: 09/896,147

(22) Filed: Jun. 29, 2001

(65) Prior Publication Data
US 2002/0032550 A1 Mar. 14, 2002

Related U.S. Application Data

(60) Provisional application No. 60/215,697, filed on Jun. 29, 2000.

(51) Int. Cl.
*G06F 7/48* (2006.01)
*G06F 17/10* (2006.01)

(52) U.S. Cl. ................... 703/10; 703/2; 702/5
(58) Field of Classification Search .......... 703/2, 703/10; 367/72; 345/419, 420; 702/5
See application file for complete search history.

(56) References Cited

U.S. PATENT DOCUMENTS

| 3,029,018 A | 4/1962 | Floyd, Jr. ............. 703/9 |
| 3,302,710 A | 2/1967 | Odeh ............... 166/269 |
| 4,821,164 A | 4/1989 | Swanson ............. 702/5 |
| 5,255,212 A | 10/1993 | Kondoh et al. .......... 703/9 |
| 5,432,718 A | 7/1995 | Molvig et al. .......... 703/9 |
| 5,553,009 A | 9/1996 | Meshkat et al. ........ 716/20 |
| 5,572,634 A | 11/1996 | Duluk, Jr. ........... 345/419 |
| 5,604,911 A | 2/1997 | Ushiro ............... 703/2 |
| 5,617,322 A | 4/1997 | Yokota ................ 700/98 |
| 5,675,521 A | 10/1997 | Holzhauer et al. ....... 716/20 |
| 5,699,271 A | 12/1997 | Sagawa et al. ......... 716/20 |
| 5,710,726 A | 1/1998 | Rowney et al. ......... 703/10 |

(Continued)

FOREIGN PATENT DOCUMENTS

EP 0 709 789 A2 5/1996

(Continued)

OTHER PUBLICATIONS

Wheeler et al., A Parallel Multiblock/Multidomain Approach for Reservoir Simulation, Proceedings of the 1999 15th symposium on Reservoir Simulation, Houston, TX, Feb. 1999.*

(Continued)

*Primary Examiner*—Russell Frejd
(74) *Attorney, Agent, or Firm*—Toler, Larson & Abel LLP

(57) ABSTRACT

Methods and systems for adapting an unstructured mesh to a modeled space. In one embodiment, a surface is defined in the modeled space, intersections of the surface with the elements of the mesh are determined, and new elements within the intersected elements are defined such that one or more of the faces of the new elements are substantially coincident with the surface. For each element which is intersected by the surface, a plurality of points at which the edges of the element are intersected is determined. For each point of intersection, a new node is located at that point and two new elements which incorporate the new node are created. This process is performed for each of the points of intersection so that the intersected element is subdivided into an new elements which include faces that lie substantially on the modeled surface.

23 Claims, 11 Drawing Sheets

U.S. PATENT DOCUMENTS

| | | | | |
|---|---|---|---|---|
| 5,740,342 | A | 4/1998 | Kocberber | 395/120 |
| 5,754,181 | A | 5/1998 | Amdursky et al. | 345/419 |
| 5,891,131 | A | 4/1999 | Rajan et al. | 606/5 |
| 5,966,524 | A | 10/1999 | Burnett et al. | 703/5 |
| 5,999,187 | A | 12/1999 | Dehmlow et al. | 345/420 |
| 6,014,473 | A | 1/2000 | Hossack et al. | 382/294 |
| 6,018,497 | A * | 1/2000 | Gunasekera | 367/72 |
| 6,028,607 | A | 2/2000 | Chan | 345/419 |
| 6,041,017 | A | 3/2000 | Goldsberry | 367/38 |
| 6,052,520 | A | 4/2000 | Watts, III | 703/10 |
| 6,054,992 | A | 4/2000 | Gibson | 345/424 |
| 6,064,810 | A | 5/2000 | Raad et al. | 703/23 |
| 6,070,125 | A | 5/2000 | Murphy et al. | 702/11 |
| 6,078,869 | A | 6/2000 | Gunasekera | 702/6 |
| 6,106,561 | A | 8/2000 | Farmer | 703/10 |
| 6,191,796 | B1 | 2/2001 | Tarr | 345/581 |
| 6,313,837 | B1 * | 11/2001 | Assa et al. | 345/420 |
| 6,445,390 | B1 | 9/2002 | Aftosmis et al. | 345/421 |
| 6,448,788 | B1 | 9/2002 | Meaney et al. | 324/637 |
| 6,516,080 | B1 | 2/2003 | Nur | 382/109 |
| 6,552,724 | B1 | 4/2003 | Marshall | 345/420 |
| 6,587,104 | B1 | 7/2003 | Hoppe | 345/423 |
| 6,608,628 | B1 | 8/2003 | Ross et al. | 345/619 |
| 6,674,432 | B1 * | 1/2004 | Kennon et al. | 345/419 |
| 6,816,820 | B1 | 11/2004 | Friedl et al. | 703/2 |
| 2002/0032494 | A1 | 3/2002 | Kennon et al. | 700/98 |
| 2002/0032550 | A1 | 3/2002 | Ward et al. | 703/2 |
| 2002/0035453 | A1 | 3/2002 | Pond, Jr. et al. | 703/2 |
| 2002/0046014 | A1 | 4/2002 | Kennon | 703/9 |
| 2002/0067373 | A1 | 6/2002 | Roe et al | 715/762 |
| 2002/0072882 | A1 | 6/2002 | Lim et al. | 703/2 |
| 2002/0082813 | A1 | 6/2002 | Lim et al. | 703/2 |

FOREIGN PATENT DOCUMENTS

| | | |
|---|---|---|
| EP | 0 801 364 B1 | 7/2003 |
| FR | 2775094 | 8/1999 |
| GB | 2326747 | 12/1998 |
| GB | 2326747 A | 12/1998 |
| WO | WO 99/40532 | 8/1999 |
| WO | WO 99/52048 | 10/1999 |
| WO | WO 99/57418 | 11/1999 |
| WO | WO 02/01251 A2 | 1/2002 |
| WO | WO 02/02901 A2 | 1/2002 |
| WO | WO 02/03101 A2 | 1/2002 |
| WO | WO 02/03103 A2 | 1/2002 |
| WO | WO 02/03262 A2 | 1/2002 |
| WO | WO 02/03263 A2 | 1/2002 |
| WO | WO 02/03264 A2 | 1/2002 |
| WO | WO 02/03265 A2 | 1/2002 |

OTHER PUBLICATIONS

Page et al., A Functional Program Describing a Simple Reservoir Model and Its Potential for Parallel Computation, Proceedings of the 1990 Symposium onApplied Computing, IEEE, Apr. 1990, pp. 85-91.*

Giertsen, Volume Visualization of Sparse Ireegular Meshes, Computer Graphics and Applications, IEEE, vol. 2, No. 2, Mar. 1992, pp. 40-48.*

Kahaner et al., An Experimental Algorithm for N-Dimensional Adaptive Quadrature, ACM Transactions on Mathematical Software (TOMS), Mar. 1979, pp. 86-96.*

Forsyth, "Local Mesh Refinement and Modeling of Faults and Pinchouts," SPE Form Eval, Jun. 1986, vol. 1, No. 3, pp. 275-285.

Ding et al., "Development of Dynamic Local Grid Refinement in Reservoir Simulation," Proceedings of the 12th SPE Symposium on Reservoir Simulation, New Orleans, LA, Feb. 28-Mar. 3, 1993, pp. 501-510.

Verma et al., "Control Volume Scheme for Flexible Grids in Reservoir Simulation," Proceedings of the 1997 SPE Reservoir Simulation Symposium, Dallas, TX, Jun. 8-11, 1997, pp. 215-227.

Kocberber, "An Automatic, Unstructured Control Volume Generation System for Geologically Complex Reservoirs," Proceedings of the 1997 SPE Reservoir Simulation Symposium, Dallas, TX, Jun. 8-11, 1997, pp. 241-252.

Kuwauchi et al., "Development and Applications of a Three Dimensional Voronoi-Based Flexible Grid Black Oil Reservoir Simulator," SPE Asia Specific Oil & Gas Conference, Adelaide, Australia, Oct. 28-31, 1996, pp. 1-12.

International Search Report dated Mar. 22, 2002.

P.A. Forsyth, et al., "Local Mesh Refinement and Modeling of Faults and Pinchouts", SPE Form Evaluation, Jun. 1986, vol. 1, No. 3, pp. 275-285. XP-002191830.

Y. Ding, et al., "Development of Dynamic Local Grid Refinement in Reservoir Simulation", Proceedings of the 13th SPE Symposium on Reservoir Simulation, New Orleans, LA, Feb.-Mar. 1993, pp. 501-510. XP-002191831.

S. Vema, et al., "A Control Volume Scheme for Flexible Frids in Reservoir Simulation", Proceedings of the 1997 SPE Reservior Simulation Symposium, Dallas, TX, Jun. 1997, pp. 215-227. XP-002191832.

S. Kocberber, et al., "An Automatic, Unstructured Control Volume Generation System for Geologically Complex Reservoirs", Proceedings of the 1997 SPE Reservior Simulation Symposium, Dallas, TX, Jun. 1997, pp. 241-252. XP-002191833.

Y. Kuwauchi, et al., "Development and Applications of a Three Dimentsional Voronoi-Based Fexible Grid Black Oil Reservoir Simulator", SPE Asia Specific Oil & Gas Congerence, Adelaide, Australia, Oct. 1996, pp. 1-12. XP-002191834.

R. Page, et al., "A Functional Program Describing a Simple Reservoir Model and Its Potential for Parallel Computation", Proceedings of the 1990 Symposium on Applied Computing, IEEE, Apr. 1990, pp. 85-91.

C. Giertsen, et al., "Volume Visulization of Sparse Irregular Meshes", Computer Graphics and Applications, IEEE, vol. 2, No. 2, Mar. 1992, pp. 40-48.

S. Ghosh, "Curvilinear Local Grid Refinement", SPE 50633, SPE European Petroleum Conference, The Netherlands, Oct., 22-22, 1998.

H. N. Sharpe, et al., "A New Adaptive Orthogonal Grid Generation Procedure for Reservoir Simulation" 65th Annual Technical Conference and Exhibition of the Society of Petroleum Engineers, New Orelans, LA, Sep. 23-26, 1990.

M. Wheeler, et al., "A Parallel Multiblock/Multidomain Approach for Reservoir Simulation", Proceedings of the 1999 15th Symposium on Reservoir Simulation, Houston, TX, Feb. 1999, XP-002188857.

D. Kahaner, et al., "An Exprimental Algorithm for N-Dimensional Adaptive Quadrature", ACM Transactions on Mathematical Software (TOMS), Mar. 1979, pp. 86-96.

Y. Ozdogan, "Seismic Data Processing", Society of Exploration Geophysics, Tulsa, OK, 1991, p. 514-515.

S. Norris, et al., "Modeling Fluid Flow Around Horizontal Wellbores", Proceedings: SPE Annual Technical Conference and Exhibition 1990 Part 4, New Orleans, LA Sep. 23-26, 1990, vol. SIGMA, pp. 65-75.

P. Perrochet, "Finite Hyperelements: A 4D Geometrical Framework Using Coariant Baes and Metric Tensors" Communications in Numberical Methods in Engineering, Jun. 1995, UK, vol. 11, No. 6, pp. 525-534.

J.M.M. Regtien, et al., "Interactive Reservoir Simulation", Proceedings of the 13th Symposium on Reservoir Simulation, San Antonio, TX Feb. 12-15, pp. 545-552.

C. Buckalew, et al., "Oilfield Visulization on the PC Platform", 2000 SPE/AAPG Western Regional Meeting, Jun. 19-23, 2000, pp. 1-5.

E. Farkas, Linearization Techniques of Reservoir Simulation Equations: Fully Implicit Cases, Proceedigns of the 1997 SPE Reservoir Simulation Symposium, Dallas, Texas Jun. 8-11, 1997, pp. 87-95.

E. Farkas, Linearization Techniques of Reservoir Simulation Equations: Fully Implicit Cases, Richardson, Texas, Dec. 1998, vol. 3, No. 4, pp. 316-323.

P. Benedeck, Capacitances of Planar Multiconductor Configuration on a Dielectric Substrate by a Mixed Order Finite-Element Method, IEEE 1974.

Fu, et al., Time Integration Procedures for a Cyclic Thermoviscoplasticity Model for Pb-Sn solder applications, IEEE 1996.

P. J. Zwart, et al., "Space-Time Meshing for Two-Dimensional Moving Boundary Problems", Proceedings of the Seventh International Meshing Roundtable, pp. 187-199, 1998.

S. L. Ho, et al., "Generation and Rotation of 3-D Finite Element Mesh for Skewed Rotor Induction Motors Using Extrusion Technique", IEEE Transactions on Magnetics, pp. 1266-1269, May 1999.

* cited by examiner 2 nodes, 1 edge 1 node, 2 edges 3 edges 4 edges

METHOD FOR MODELING AN ARBITRARY WELL PATH IN A HYDROCARBON RESERVOIR USING ADAPTIVE MESHING

RELATED APPLICATIONS

This application claims priority under 35 U.S.C. § 119(e) to U.S. patent application Ser. No. 60/215,697 entitled "METHOD AND SYSTEM FOR OIL RESERVOIR SIMULATION AND MODELING," by Stephen R. Kennon, Kok-Thye Lim, Scott A. Canaan, Steven B. Ward, Stuart W. Pond, Jr., and Edward J. Barragy, filed Jun. 29, 2000.

FIELD OF THE INVENTION

This invention relates generally to methods and systems for modeling physical systems using finite element analysis and, more specifically, to methods and systems for adapting a finite element mesh to an arbitrary surface such as an arbitrary well path trajectory in a hydrocarbon reservoir.

BACKGROUND OF THE INVENTION

Physical systems can be modeled mathematically to simulate their behavior under certain conditions. There are a wide variety of means to model these systems, ranging from the very simplistic to the extremely complicated. One of the more complicated means to model physical systems is through the use of finite element analysis. As the name implies, finite element analysis involves the representation of individual, finite elements of the physical system in a mathematical model and the solution of this model in the presence of a predetermined set of boundary conditions.

In finite element modeling, the region that is to be analyzed is broken up into sub-regions called elements. This process of dividing the region into sub-regions may be referred to as discretization or mesh generation. The region is represented by functions that are defined over each element. This generates a number of local functions that are much simpler than those which would be required to represent the entire region. The next step in the process is to analyze the response for each element. This is accomplished by building a matrix that defines the properties of the various elements within the region and a vector that defines the forces acting on each element in the structure. Once all the element matrices and vectors have been created, they are combined into a matrix equation. This equation relates nodal responses for the entire structure to nodal forces. After applying boundary conditions, the matrix equation can be solved to obtain unknown nodal responses. Intra-element responses can be interpolated from nodal values using the functions which were defined over each element.

As indicated above, finite element modeling involves the creation of a mesh of finite elements. The elements are defined by nodes within the problem space. The nodes are simply points in space. The lines between the nodes are referred to as "edges." The mesh is typically a structured mesh. In other words, the mesh is defined in three dimensions so that the elements within the problem space are hexahedrons. For example, they may be cubes or rectangular prisms. (Equivalently, in two dimensional problems, the elements would be rectangles—see FIG. 1 for an illustration of these elements.) The edges of the hexahedrons are coincident with the edges between the nodes of the mesh. In a simple model, the nodes of the mesh may be regularly spaced to define cubic elements. It is not necessary, however, for the nodes to be evenly spaced in all finite element models. A variety of different sizes and shapes of hexahedral elements can be defined within a single mesh.

One of the problems with meshes which use hexahedral elements is that they do not lend themselves well to complex geometries which may need to be modeled. In other words, it may be difficult to place nodes sufficiently close to irregular surfaces to accurately determine the solution to the problem along those surfaces. Viewed another way, it is difficult to fill an irregularly shaped object with regularly shaped boxes. This situation is further complicated by limitations on the minimum distance between nodes in a structured mesh. Even when additional nodes elements can be defined in the mesh to improve the accuracy of the model, the inclusion of these additional elements causes the resources needed to solve the resulting model to increase. If increased accuracy is desired, an increased number of elements, as well as greater computing power, is required.

One way to reduce the cost associated with increasing the accuracy of a finite element model is to use an unstructured mesh. In an unstructured mesh, the elements which comprise the mesh are not constrained to fit within a predetermined structural scheme. For example, the elements are not required to be selected from a finite set of predefined element shapes (e.g., hexahedra) or sizes (e.g., fractions of an initial size.) More particularly, it may be convenient to employ a mesh that comprises simplex elements which have no predefined constraints. Because the faces of the simplex elements need not be parallel to predetermined planes (e.g., the X-Y, Y-Z or X-Z planes,) they can be oriented to follow the contours of a surface that is being modeled and may therefore achieve accuracy that is on par with a structured mesh. As a result, an unstructured mesh that conforms to the geometry is simpler to create.

Although unstructured meshes may be capable of more accurately modeling irregular surfaces than structured meshes, it may nevertheless be difficult to construct an unstructured mesh in such a way that the irregular surfaces are properly modeled. If the surfaces are not essentially coincident with the faces of the elements in the mesh (or more particularly some of the element faces,) then this advantage is minimized or lost. It would therefore be useful to develop a method for defining the elements of the unstructured mesh so that the surface is accurately defined by one or more faces of the elements of the mesh.

SUMMARY OF THE INVENTION

One or more of the problems outlined above may be solved by the various embodiments of the invention. Broadly speaking, the invention comprises a method for adapting an unstructured finite element mesh to accurately model a surface in the region to be modeled. This method may provide a number of advantages over prior art methods, including increasing the accuracy of the model, simplifying the model, eliminating the need to use special functions to approximate the behavior of features such as well bores, and reducing the computing resources needed to solve the model.

In one embodiment, the method comprises constructing an unstructured mesh corresponding to the modeled space, defining a surface in the modeled space, determining the intersections of the surface with the elements of the mesh, and defining new elements within the intersected elements such that one or more of the faces of the new elements are substantially coincident with the surface (that is, they lie approximately on the surface.) More specifically, for each element which is intersected by the surface, a plurality of points at which the edges of the element are intersected is determined. (If the element is only intersected at a single point, it need not be subdivided into two or more new elements.) For each point of intersection, a new node is located at that point and two new elements which incorporate the new node is created.

This process is performed for each of the points of intersection so that the intersected element is subdivided into an appropriate number of new elements, some of which include faces that lie substantially on the modeled surface.

Various alternative embodiments are also possible. These may include software or firmware applications which embody methods such as are described above, as well as computer-readable media containing such applications and computers or other data processing systems which are configured to perform the described methods.

BRIEF DESCRIPTION OF THE DRAWINGS

Other objects and advantages of the invention may become apparent upon reading the following detailed description and upon reference to the accompanying drawings in which.

Figure 1:
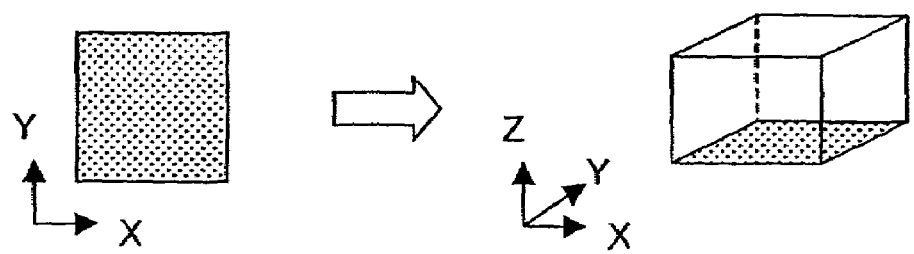
FIG. 1 is an illustration of the rectangular and hexahedral elements which comprise structured finite element meshes in the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF A PREFERRED EMBODIMENT

A preferred embodiment of the invention is described below. It should be noted that this and any other embodiments described below are exemplary and are intended to be illustrative of the invention rather than limiting.

The present method and system are directed generally to constructing and solving finite element models. More particularly, they are directed to the construction of finite element meshes and the refinement of these meshes so that the faces of some of the elements are coincident with identified surfaces in the modeled space.

Broadly speaking, the present method comprises constructing an initial unstructured mesh of simplex elements, identifying intersections between the elements of the mesh and a surface to be modeled, then redefining the intersected elements to include faces coincident with the surface. More particularly, new nodes are located at the points of intersection and are used as the basis for subdividing the initial elements into new elements. The number of new elements which are created from a particular element depends upon the manner in which the surface intersects that element. The new elements are created in such a way that they are simplices in the modeled space. The present method is employed in the generation of multi-dimensional finite element models. It should be noted that, while the examples described below include only two- and three-dimensional meshes, the method is generally applicable in n dimensions.

It may be helpful before describing the present method in detail to define a few terms relating to finite element meshes.

A node is a point in space. In finite element modeling, nodes form the vertices of the elements which are modeled. The nodes also form part of a mesh of nodes and edges which define the boundaries between elements in the modeled space.

An edge is a line between two nodes which form vertices of an element. The edges form part of the mesh which defines the boundaries between elements in the modeled space.

A simplex is a spatial configuration of n dimensions determined by n+1 points in a space of dimension equal to or greater than n. In other words, a simplex is a geometric spatial element having the minimum number of boundary points necessary to enclose a space in a given number of dimensions. For example, in two dimensions, a simplex comprises a triangle, together with the interior area bounded by the triangle (see FIG. 6.) Two points are insufficient to form a simplex in two-dimensional space because no area is bounded by the points (and the lines which interconnect them.) While four points may be sufficient to bound a two-dimensional area, they do not comprise the minimum number of boundary points by which the two-dimensional area can be bounded. In three dimensions, a simplex comprises a tetrahedron, together with the interior volume bounded by the tetrahedron. It is defined by four vertices (see FIG. 6.) In four dimensions, a simplex is a hypertetrahedron (sometimes referred to as a hypertet), along with the four-dimensional volume inside the hypertetrahedron, and has five vertices.

A face is an n-1-dimensional surface of an n-dimensional element. For example, in a two-dimensional element, each of the lines which bounds the area of the element is a face of that element. In a three-dimensional element, each of the triangles which bounds the volume of the element is a face of that element. Preferably, the faces of the elements in a finite element model are located so that they are coincident with surfaces or boundaries within the modeled space.

A mesh is a collection of elements that fill a modeled space. These elements are representative of a system which resides in that space. Because each element can be defined by a plurality of nodes and/or the edges between those nodes, a mesh may alternatively be considered a collection of nodes and/or the edges between them. At various points in this disclosure, "mesh" will be used to alternately refer to collections of elements or nodes/edges, depending upon the context in which the term is used. The mesh may also be referred to herein as a finite element model or simply a model.

Figure 2:
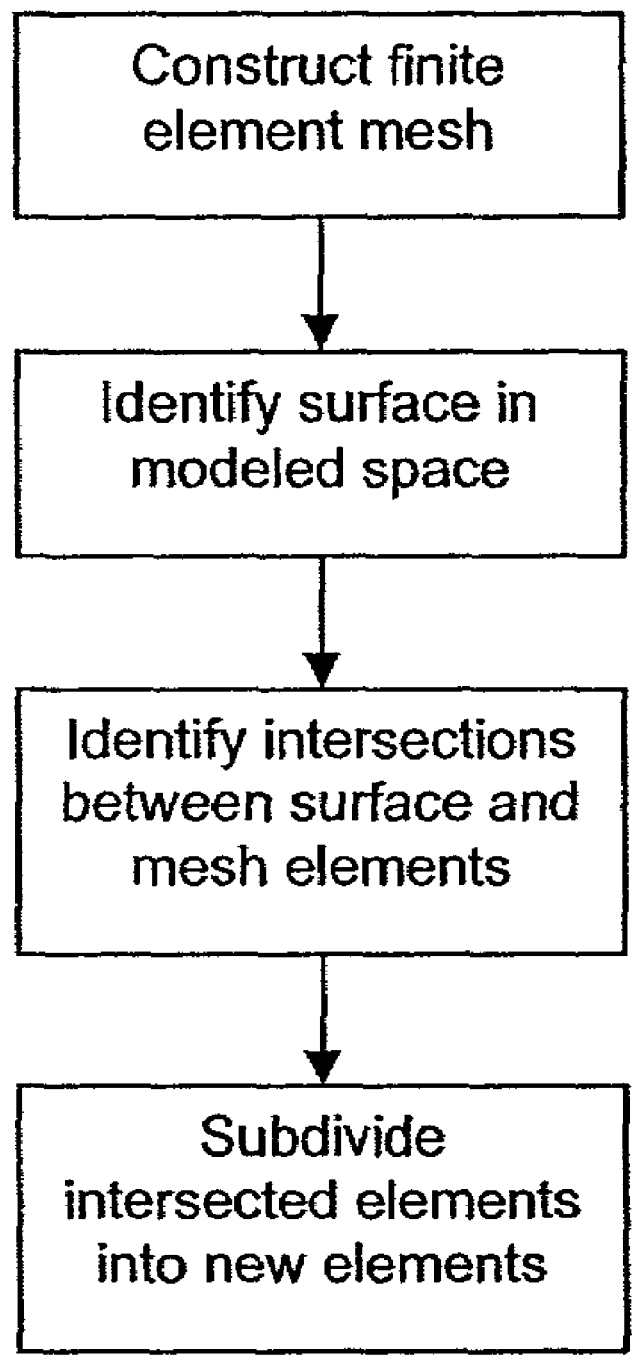
FIG. 2 is a flow diagram illustrating the basic steps of one embodiment of the present method.

Referring to FIG. 2, a flow diagram illustrating the basic steps of one embodiment of the present method is shown. Generally speaking, the method comprises constructing an unstructured mesh corresponding to a space which is being modeled, then identifying a surface in the modeled space and determining the intersections of the surface with the elements of the mesh, and finally defining new elements within the intersected elements so that one or more of the faces of the new elements are substantially coincident with the surface. ("substantially coincident" is used herein to refer to element edges or faces for which the corresponding nodes lie on a curve or surface.) These faces approximate the modeled surface.

Each element in the mesh has a corresponding set of nodes which comprise the vertices of the element. Likewise, each element has a corresponding set of edges which connect the vertices. In the present method, the intersection of a surface with an element is characterized by the points at which the surface intersects with the nodes and/or edges of the element. Consequently, identifying the intersection of a surface with the element comprises determining the points at which the surface intersects the nodes and/or edges. These points of intersection are then used as nodes for two or more newly defined elements. The new elements effectively include the intersecting portion of the surface as one of the faces of the new elements.

Figure 3A:
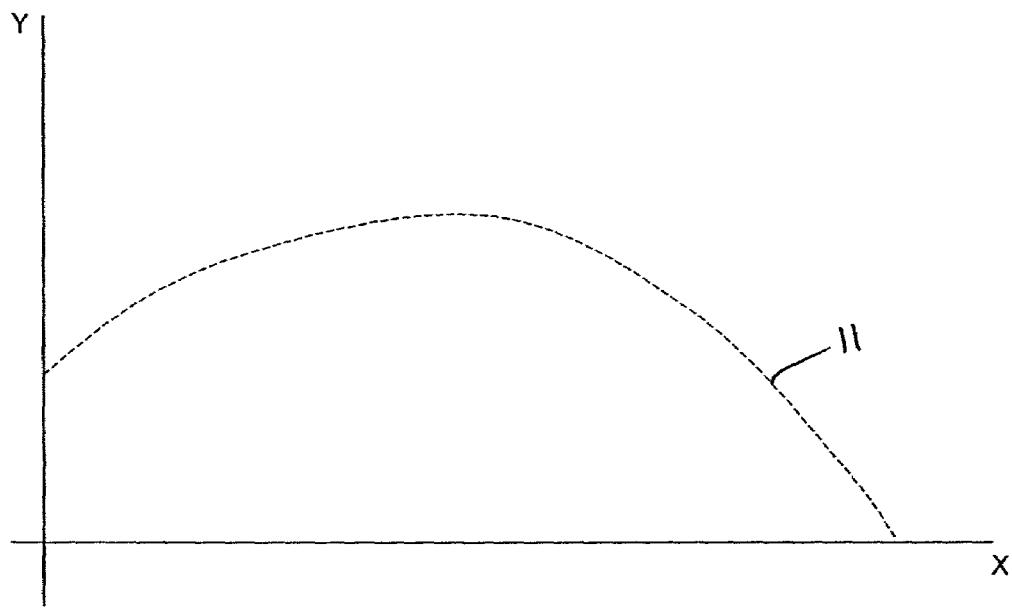
FIGS. 3A–3B are illustrations of a curve in two-dimensional space and an initial unstructured mesh that could be used as the basis for modeling the curve.
Figure 3B:
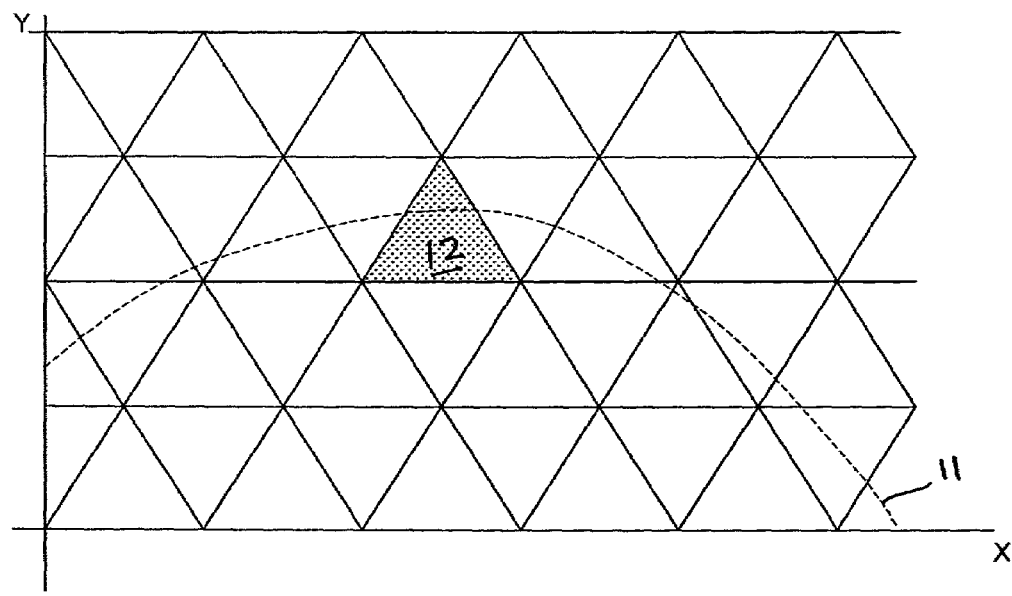

A two-dimensional example is illustrated in FIGS. 3–4. FIG. 3A shows a curve 11 which represents a surface in two-dimensional space. FIG. 3B shows a two-dimensional mesh which is constructed to model the space containing curve 11. The mesh comprises a series of triangular elements which are simplices in two-dimensional space. One of the elements, identified by reference number 12, is highlighted—this element will be referred to in the following description of the manner in which the elements are subdivided. Although the elements in this initial mesh are regular, it should be noted that the mesh is unstructured, and the elements may have any suitable size or shape (keeping in mind that they must be simplices.) Curve 11 is also shown in this figure.

It can be seen that the elements of the initial mesh do not follow the curve. In other words, the curve does not lie substantially along the edges of the elements. Instead, the curve intersects a number of the elements, traversing some path across the space bounded by these elements. Because it is desired to construct a mesh in which the faces of the elements coincide with the curve, it is necessary to modify or refine the mesh. In the present method, this is accomplished by effectively adding edges that lie on the curve (subdividing the existing elements into new elements which include the added edges.)

Figure 4A:
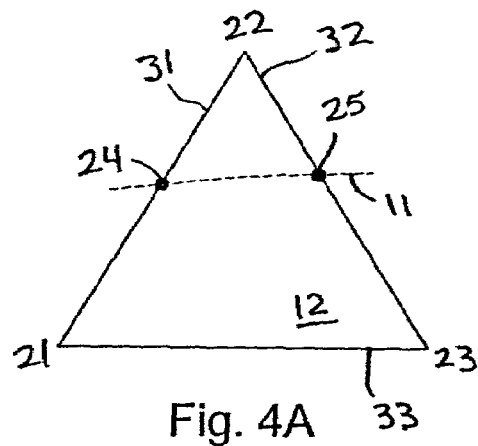
FIGS. 4A–4C are a set of diagrams illustrating the manner in which an element of the unstructured mesh of FIG. 3B is subdivided into sub-elements which can more accurately model the curve which intersects the original element.
Figure 4B:
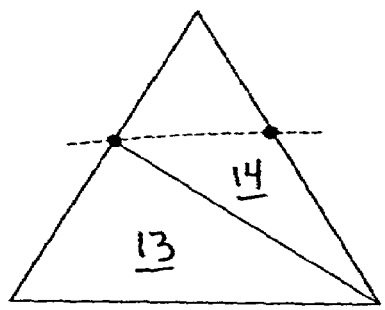
Figure 4C:
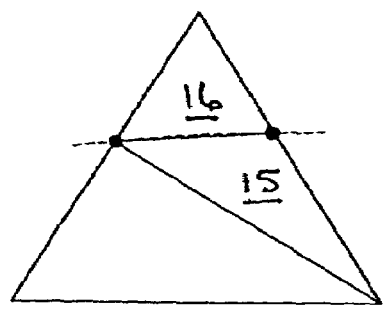

Referring to FIGS. 4A–4C, element 12 is shown apart from the mesh. A portion of curve 11 which intersects element 12 is also shown in this figure. Element 12 is defined by the three points (21, 22, 23) which form its vertices. The area within element 12 is bounded by the edges (31, 32, 33) which connect the vertices. As indicated above, it is necessary to identify the intersections between curve 11 and edges 31, 32 and 33. It is a relatively straightforward matter to calculate the intersections between the curves and the edges based upon the mathematical representation of each. It can be seen from FIG. 4A that curve 11 intersects edge 31 at point 24. Likewise, curve 11 intersects edge 32 at point 25.

An edge connecting points 24 and 25 would be substantially coincident with curve 11 in the space covered by element 12. That is, an edge connecting points 24 and 25 would closely approximate the portion of curve 11 which traverses element 12. Creation of an edge between points 24 and 25, however, would not, by itself, be a sufficient refinement of the mesh because this would divide element 12 into a triangular area and a second area bounded by an irregular quadrilateral, which is not a simplex in two-dimensional space. The space covered by the quadrilateral must therefore be subdivided into simplices (triangular elements.)

Referring to FIGS. 4B and 4C, the manner in which element 12 is subdivided into a plurality of new simplex elements is illustrated. Once the locations of points 24 and 25 are identified, element 12 is subdivided as follows: first, a node is placed at point 24 and an edge is created between this node and the opposite vertex of element 12 (point 23.) ("Opposite," as used here, refers to the vertex which is opposite the edge (31) on which the new node is located.) This creates new elements 13 and 14. Element 13 is defined by vertices at points 21, 23 and 24, while element 14 is defined by vertices at points 22, 23 and 24. Then, a node is placed at point 25 and an edge is created between this node and the node at point 24 (the opposite vertex of element 14.) This edge forms a segment of the modeled curve. As shown in FIG. 4C, the addition of this edge results in the creation of new elements 15 and 16. Element 15 is defined by vertices at points 23, 24 and 25, while element 16 is defined by vertices at points 22, 24 and 25.

Now, instead of having a single simplex element 12 which is intersected by curve 11 (and does not have a face which is coincident with the curve,) there are three new elements (13, 15 and 16,) each of which is still a simplex in two-dimensional space, and two of which share a face that lies on curve 11. This same process can be repeated with each of the original mesh elements so that an edge is created wherever curve 11 traverses one of the elements. The result is an unstructured mesh of simplex elements which have edges that closely approximate the path of curve 11 and consequently enable the accurate modeling of the surface represented by the curve.

Figure 5:
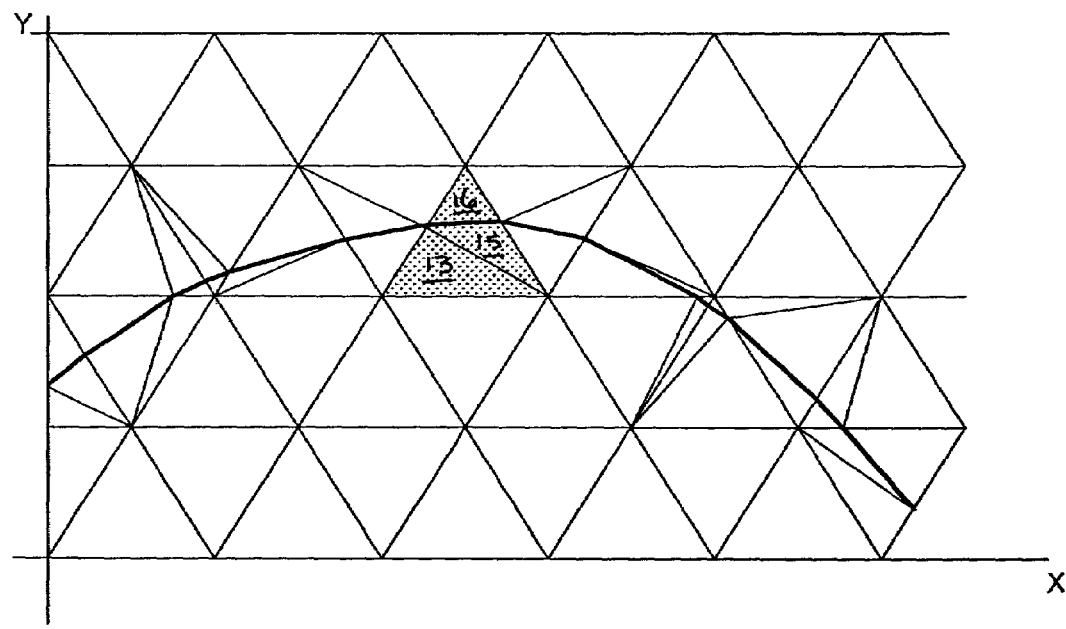
FIG. 5 is an illustration of a refined mesh which is adapted to model the curve shown in FIGS. 3A and 3B.

Referring to FIG. 5, the refined mesh generated by applying the foregoing method to each of the intersected elements of FIG. 3B is shown. The edges of the new simplices which are substantially coincident with curve 11 are shown in heavy lines so they can be easily seen. It is apparent from the figure that the new edges provide a close approximation of the original curve. The curve may be matched even more closely if the mesh is refined to use smaller elements before the present method is applied, since smaller edges do a better job of approximating curved surfaces.

While each of the elements of the mesh illustrated in FIG. 3B were intersected by curve 11 from one edge to another, it should be noted that the elements could also have been intersected at a node and an edge. That is, for a particular element, curve 11 could have traversed the element between one of its nodes and the opposite edge. In this case, it would only be necessary to make a single subdivision of the element by creating a new node where the curve intersects the edge, and then defining each of the new elements to include the intersected node, the new node, and one of the remaining nodes. For example, in the example of FIGS. 4A and 4B, if the curve had traversed the element from point 24 to point 23, a new edge between these points (and resulting elements 13 and 14) would have been sufficient.

There are actually two other cases which may be encountered. In one case, the surface may intersect only a single node of the simplex element. Because this node lies on the surface, there is no need to refine the element further. The surface may also intersect the element at two nodes. In this instance, the edge of the element already lies on the surface to be modeled, so no refinement of the element is necessary. (It should be noted that the identification of the type of intersection between the element and the surface may be regarded as a separate step of the method.)

The foregoing example is a very simple illustration of one embodiment of the present method in the context of a two-dimensional mesh. The more complex case of a three-dimensional mesh is illustrated below.

Meshes of three and four dimensions are of particular interest in modeling physical systems over time. Because of the difficulty of illustrating four-dimensional systems, only the three-dimensional case will be described in detail below. The description of the three-dimensional case illustrates the manner in which the method can be extended to additional dimensions.

Figure 6:
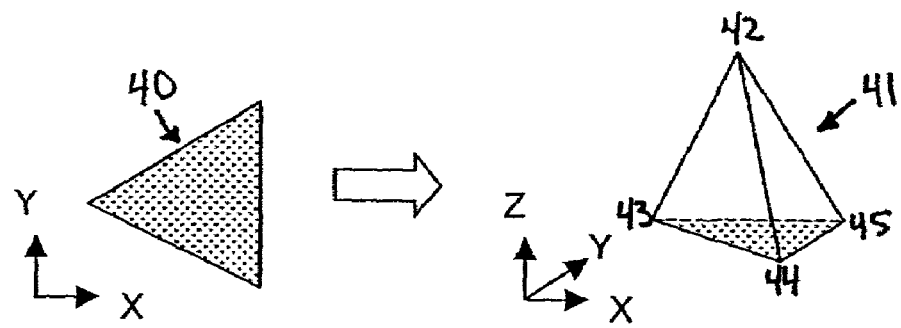
FIG. 6 is a diagram illustrating a three-dimensional simplex in comparison with a two-dimensional simplex.

Referring to FIG. 6, a three-dimensional simplex 41 is shown in comparison to a two-dimensional simplex 40. three-dimensional simplex 41 is defined by four vertices 42–45 and is bounded by the edges and faces between them. The application of the present method is, of course, somewhat more complicated in the three-dimensional case than in the two-dimensional case. One added complexity arises from the need to calculate the intersection of a three-dimensional surface with a three-dimensional edge. While this requires additional computing power with respect to the two-dimensional case, it is still relatively straightforward. Another complexity is that the intersection of a surface and a simplex may involve four different cases which could necessitate the subdividing of the simplex: intersecting one node and two edges; intersecting two nodes and one edge; intersecting three edges; or intersecting four edges. Each of these cases is handled differently. (Remember that a curve in two dimensions could also intersect a simplex at one, two or three nodes, although no subdivision of the simplex would be required in these instances.)

Although more complex, the method applied to three-dimensional meshes is generally the same as in the two-dimensional case—an initial mesh is constructed, a surface is identified, the intersections between the surface and the edges of the elements are identified, and the elements are subdivided using the intersections as nodes in the new elements. The three-dimensional method differs in that the step of subdividing the element is handled a bit differently for each of the four different types of intersections. (It should be noted that the present methods can be extended to four or more dimensions, but such cases will not be described here because of the difficulty of illustrating them clearly.)

Figure 7A:
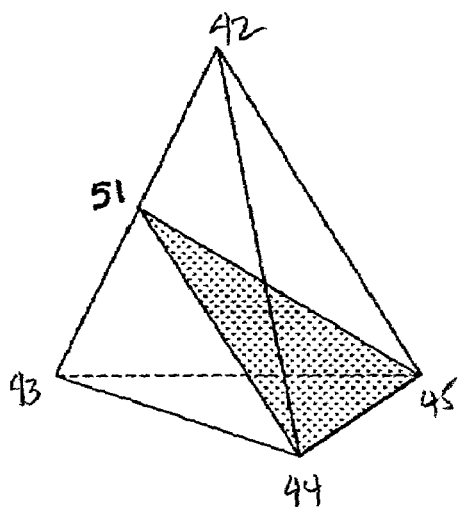
FIGS. 7A–7D are a set of diagrams illustrating the possible types of intersections between an approximately planar surface and a three-dimensional simplex.
Figure 7B:
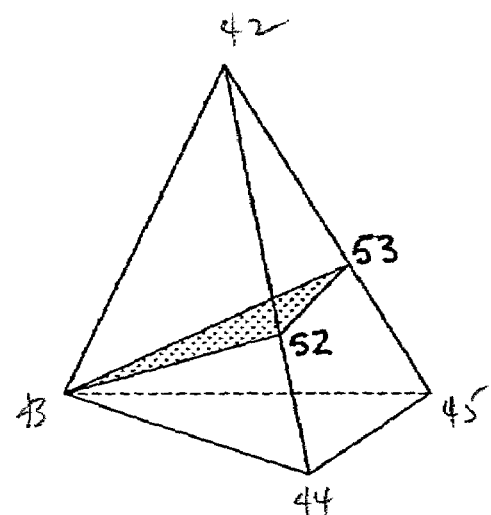
Figure 7C:
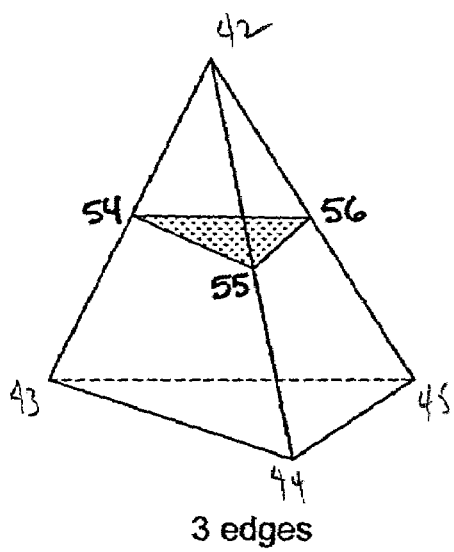
Figure 7D:
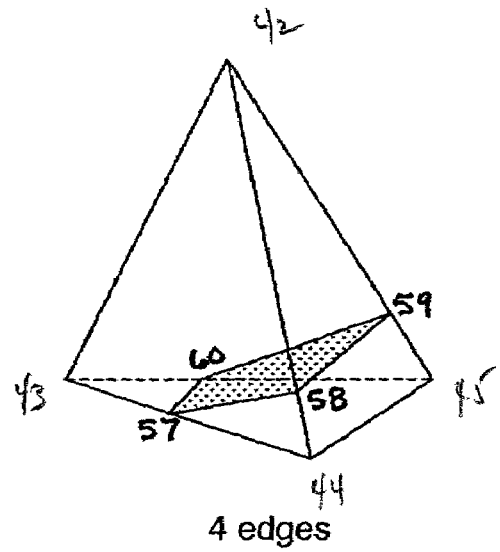

The four different types of intersections in three dimensions are illustrated in FIGS. 7A–7D. Each figure depicts the three-dimensional simplex element of FIG. 6 intersected by a surface having a different orientation. The shaded portion of the figure represents the portion of the surface that intersects the element. FIG. 7A shows the intersection of the element at two nodes (44 and 45) and one edge (51.) FIG. 7B shows the intersection of the element at one node (43) and two edges (52 and 53.) FIG. 7C shows the intersection of the element at three edges (54–56.) Finally, FIG. 7D shows the intersection of the element at four edges (57–60.)

(It should be noted that the surface may also intersect the three-dimensional element at one, two or three nodes. In the first two of these cases, the surface does not traverse the element and no subdivision of the element is necessary. In the third case, the face of the element already lies on the surface and no further action needs to be taken.)

Referring to the intersection depicted in FIG. 7A, where the surface intersects the element at two nodes and one edge, the element is subdivided by creating a face between the two nodes (44 and 45) and the point of intersection on the edge (51). This results in the creation of two tetrahedra with the vertices {43, 44, 45, 51} and {42, 44, 45, 51}. Newly created face {44, 45, 51} is a facet of the surface which is being modeled.

Figure 8A:
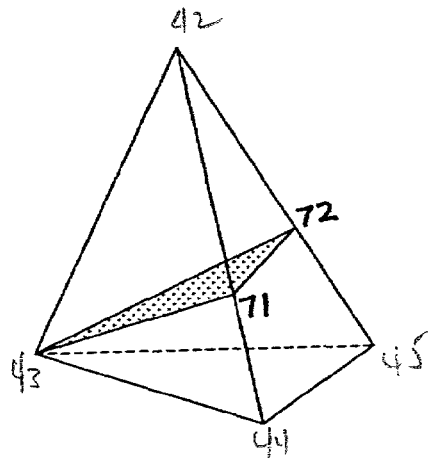
FIGS. 8A–8C are a set of diagrams illustrating the manner in which an the three-dimensional simplex of FIG. 7B is subdivided into sub-elements based upon its intersection by an approximately planar surface at one node and two edges.
Figure 8B:
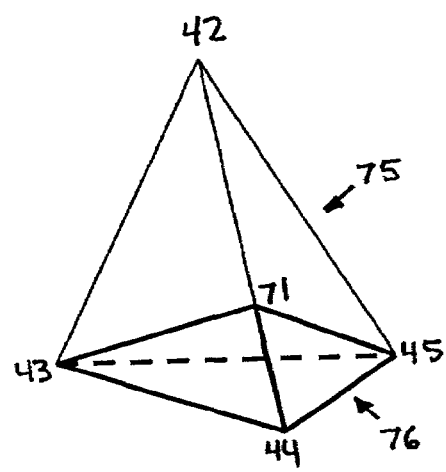
Figure 8C:
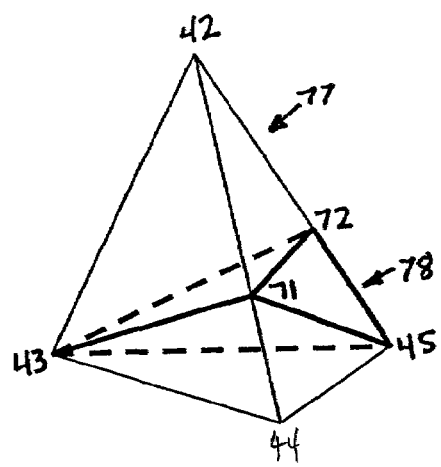

Referring to the intersection depicted in FIG. 7B, the surface intersects the element at one node and two edges. This figure is repeated as FIG. 8A for the convenience of the reader. The points of intersection with the edges of element 41 are indicated by reference numerals 71 and 72. The first step in subdividing the element is to select one of the points of intersection and to locate a node at that point. In this example, point 71 is selected. As shown in FIG. 8C, two new simplex elements, indicated by reference numbers 75 and 76, can be created using this new node. The first new element, 75, has vertices at {42, 43, 45, 71} and the second, 76, has vertices at {43, 44, 45, 71}. The next step is to place a node at the remaining point of intersection (72). This node is used as the basis for subdividing element 75 into new elements 77 and 78 (see FIG. 8C.) Element 77 has vertices at {42, 43, 71, 72} and element 78 has vertices at {43, 45, 71, 72}. Thus, the subdivision of element 41 in this case results in the creation of new elements 76, 77 and 78. The face which separates elements 77 and 78 forms a facet which is substantially coincident with the modeled surface.

Figure 9A:
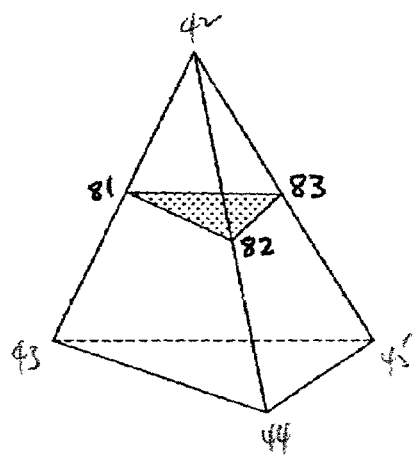
FIGS. 9A–9D are a set of diagrams illustrating the manner in which an the three-dimensional simplex of FIG. 7C is subdivided into sub-elements based upon its intersection by an approximately planar surface at three edges.
Figure 9B:
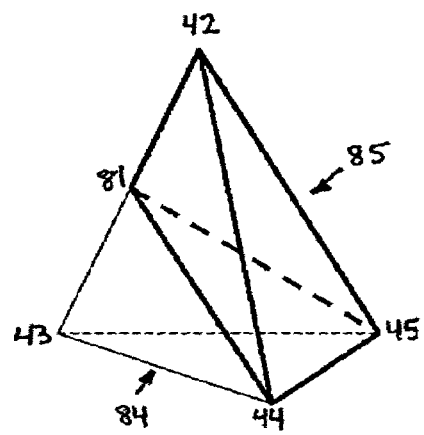
Figure 9C:
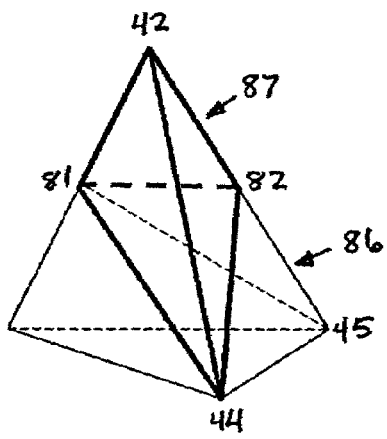
Figure 9D:
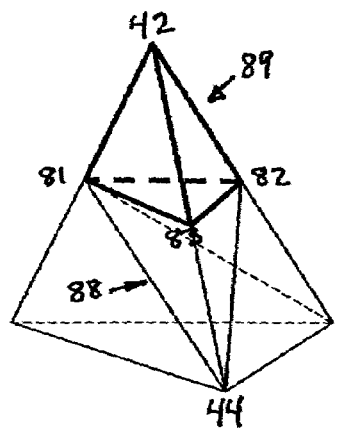

Referring to the intersection depicted in FIG. 7C, the surface intersects three edges of element 41. This figure is repeated as FIG. 9A for the convenience of the reader. The points of intersection between the surface and element 41 are indicated by reference numerals 81, 82 and 83. The process of subdividing element 41 in this case is very similar to the previous case—nodes are sequentially located at the points of intersection and new elements are created based on the addition of each node. For example, as shown in FIG. 9B, a first node is located at point 81, creating elements 84 and 85. Element 84 has vertices at {43, 44, 45, 81} and element 85 has vertices at {42, 44, 45, 81}. Then, a node is placed at the next point of intersection (82). This node is used to subdivide element 85, creating new elements 86 and 87. Element 86 has vertices at {44, 45, 81, 82} and element 87 has vertices at {42, 44, 81, 82}. Finally, a node is placed at the last point of intersection (83). Using this node, element 87 is subdivided into new elements 88 and 89. Element 88 has vertices at {44, 81, 82, 83} and element 89 has vertices at {42, 81, 82, 83}. Thus, in this case, element 41 is subdivided into four new elements—84, 86, 88 and 89. The face which separates elements 88 and 89 forms a facet of the intersecting surface and is substantially coincident with the surface.

Figure 10A:
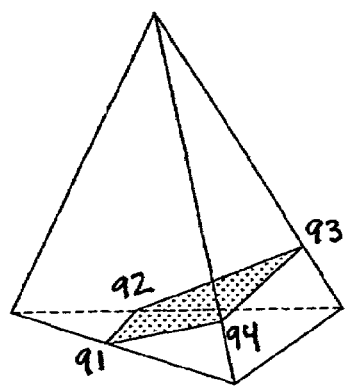
FIGS. 10A–10C are a set of diagrams illustrating the manner in which the three-dimensional simplex of FIG. 7C is subdivided into two sub-elements based upon its intersection by an approximately planar surface at four edges.
Figure 10B:
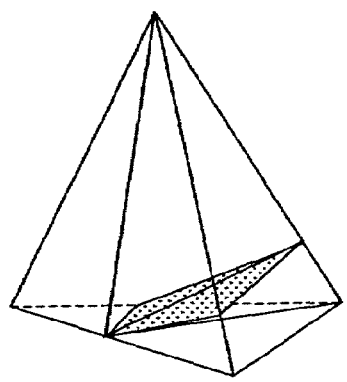
Figure 10C:
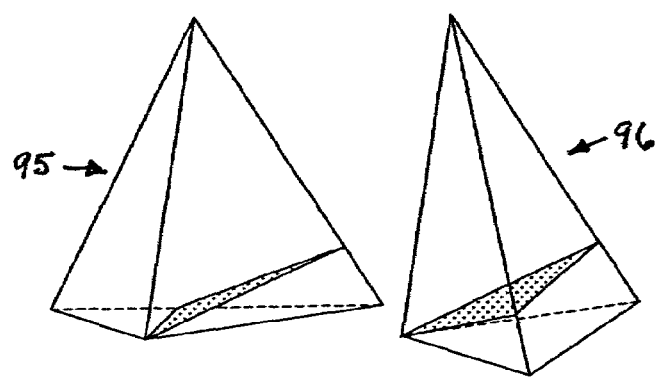

Referring to the intersection depicted in FIG. 7D, the surface intersects four edges of element 41. This figure is repeated as FIG. 10A for the convenience of the reader. The points of intersection between the surface and element 41 are indicated by reference numerals 91, 92 93 and 94. The subdivision of element 41 is illustrated in FIGS. 10A–10C, 11A–11C and 12A–12C. It should be noted that the first step in subdividing element 41 creates two new elements, 95 and 96, each of which is intersected by the surface at one node and two edges. This is illustrated in FIGS. 10B–10C. Each of these new elements can then be subdivided in the manner illustrated in FIGS. 7B–7C. The subdivision of elements 95 and 96 is shown in FIGS. 11A–11C and 12A–12C.

Figure 11A:
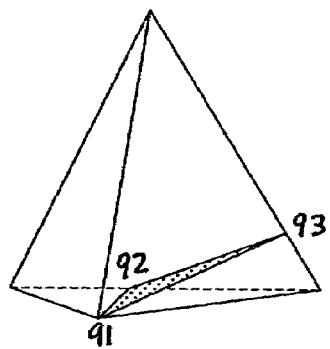
FIGS. 11A–11C are a set of diagrams illustrating the manner in which the first of the sub-elements of FIG. 10C is further subdivided into sub-elements.
Figure 11B:
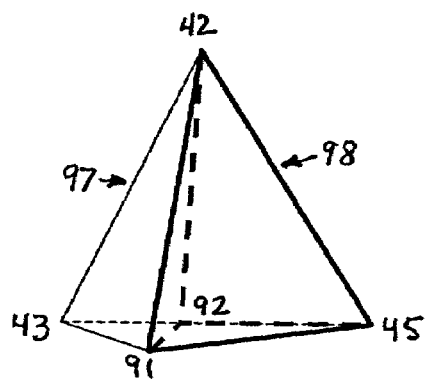
Figure 11C:
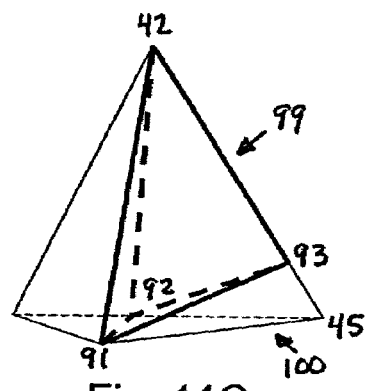

Referring to FIGS. 11A–11C, the subdivision of element 95 is illustrated. First, a node is placed at point 92, and two new elements incorporating this node are created. These are elements 97 and 98. The vertices of element 97 are at {42, 43, 91, 92} and the vertices of element 98 are at {42, 45, 91, 92}. Then, a node is placed at point 93. Based on this new node, element 98 is broken down into two new elements, 99 and 100. Element 99 has vertices at {42, 91, 92, 93} and element 100 has vertices at {45, 91, 92, 93}. The face of elements 99 and 100 which is formed between points 91, 92 and 93 forms a facet of the modeled surface.

Figure 12A:
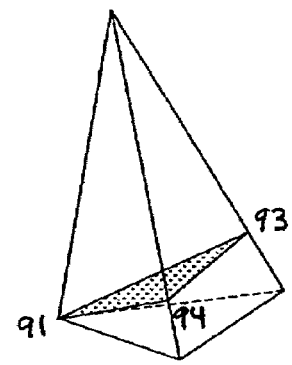
FIGS. 12A–12C are a set of diagrams illustrating the manner in which the second of the sub-elements of FIG. 10C is further subdivided into sub-elements.
Figure 12B:
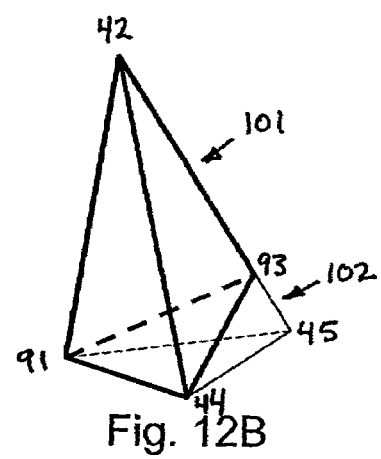
Figure 12C:
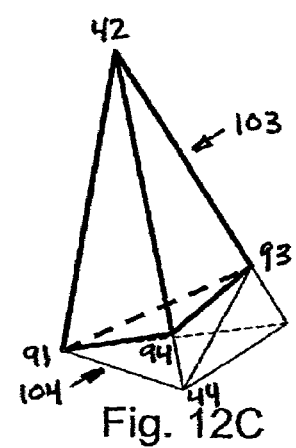

Referring to FIGS. 12A–12C, the subdivision of element 96 is illustrated. The first step is to place a node at point 93. Based on this node, two new elements are created. These elements are indicated by the reference numerals 101 and 102. The vertices of element 101 are at {42, 44, 91, 93} and the vertices of element 102 are at {44, 45, 91, 93}. Next, a node is placed at point 94. Using this new node, element 101 is broken down into two new elements, 103 and 104. Element 103 has vertices at {42, 91, 93, 94} and element 104 has vertices at {44, 91, 93, 94}. The common face of elements 103 and 104 which lies between points 91, 92 and 93 forms another facet of the modeled surface.

One application of the adaptive meshing methods described above involves the modeling of a well bore that follows an arbitrary path through a reservoir. In prior art systems, well bores were typically assumed to be aligned with the structured mesh which was used to model the reservoir. Then, functions approximating the behavior of the reservoir in the vicinity of the well bore were used for the elements containing the well bore when the model was solved. Generally speaking, these functions do not model the well bore as accurately as if the well bore surface were represented by the faces of the mesh elements, and were not at all well suited to modeling well bores having arbitrary paths.

Using the present method, a well bore in a reservoir can be accurately modeled by refining the elements of the finite element mesh to define element faces which are substantially coincident with the well bore surface. This is true even if the well bore follows an arbitrary path through the reservoir. The well bore surface is simply defined mathematically, and then the mesh is refined as described above.

In one embodiment, the well bore is defined by a trajectory and a radius. The trajectory is the path which is followed by the well bore and consists of a set of points that are ordered by their respective measured depths within the well bore. The radius is the actual radius of the well bore. The well bore can therefore be characterized mathematically by a function $F(x,y,z)-r(z)=0$, where $F(x,y,z)$ is the distance from a point in the reservoir to the trajectory of the well bore and r is the radius of the well bore. For each of the edges in the finite element mesh (or a portion of the edges that are within the vicinity of the well bore) intersections with the defined well bore surface are identified. The points at which the edges are intersected by the well bore surface are marked for refinement. The elements containing the marked edges are then refined as described above. It should be noted that the elements for which four edges are intersected are refined first. In order to maintain surface preservation, no adjacent elements having four intersected edges are refined in a single pass. If such adjacent elements are identified, one is identified for deferral to a subsequent refinement pass. It may therefore take several passes to complete the refinement of these elements. Once the elements having four intersected edges are refined, the remainder of the intersected elements can be refined in a single pass.

Because the path of the well bore through the reservoir is arbitrary, it is necessary to define a coordinate system which is convenient for both defining the well bore and identifying the intersection of the well bore with the elements of the mesh. In one embodiment, a coordinate system which tracks the path of the well bore is used. This coordinate system identifies points around the well bore using the measured depth in the well, an angular distance from a normal vector and a radial distance from the center of the well bore.

The well path is assumed to comprise a series of segments, each of which is essentially straight. Adjacent segments are joined at joints to form a continuous well path. Because adjacent segments are not coaxial, the coordinate system must account for the fact that some points near the joints may not be well defined. (That is, the coordinate system defined with respect to adjacent segments may overlap on one side of the joint and may not cover all points on the opposite side of the joint.) Consequently, a region corresponding to each segment is defined so that the region extends to a bisecting plane between that segment and an adjacent segment. This eliminates overlapped or undefined areas. (It should be noted that, for a segment at the end of the well bore, the end of the segment region near to an adjacent segment is bounded by the bisecting plane between the segments, but the other end of the segment region is bounded by a plane normal to the trajectory of the segment.)

As indicated above, the coordinate system for each segment includes a measured depth, an angular distance from a normal vector and a radial distance from the path of the well bore. The measured depth of points on the trajectory itself are well-defined. The measured depth of points which are on the inside or outside of curves in the trajectory, however, are not so well-defined. Consequently, the following method for determining the measured depth of these points is imposed on the system.

Figure 13:
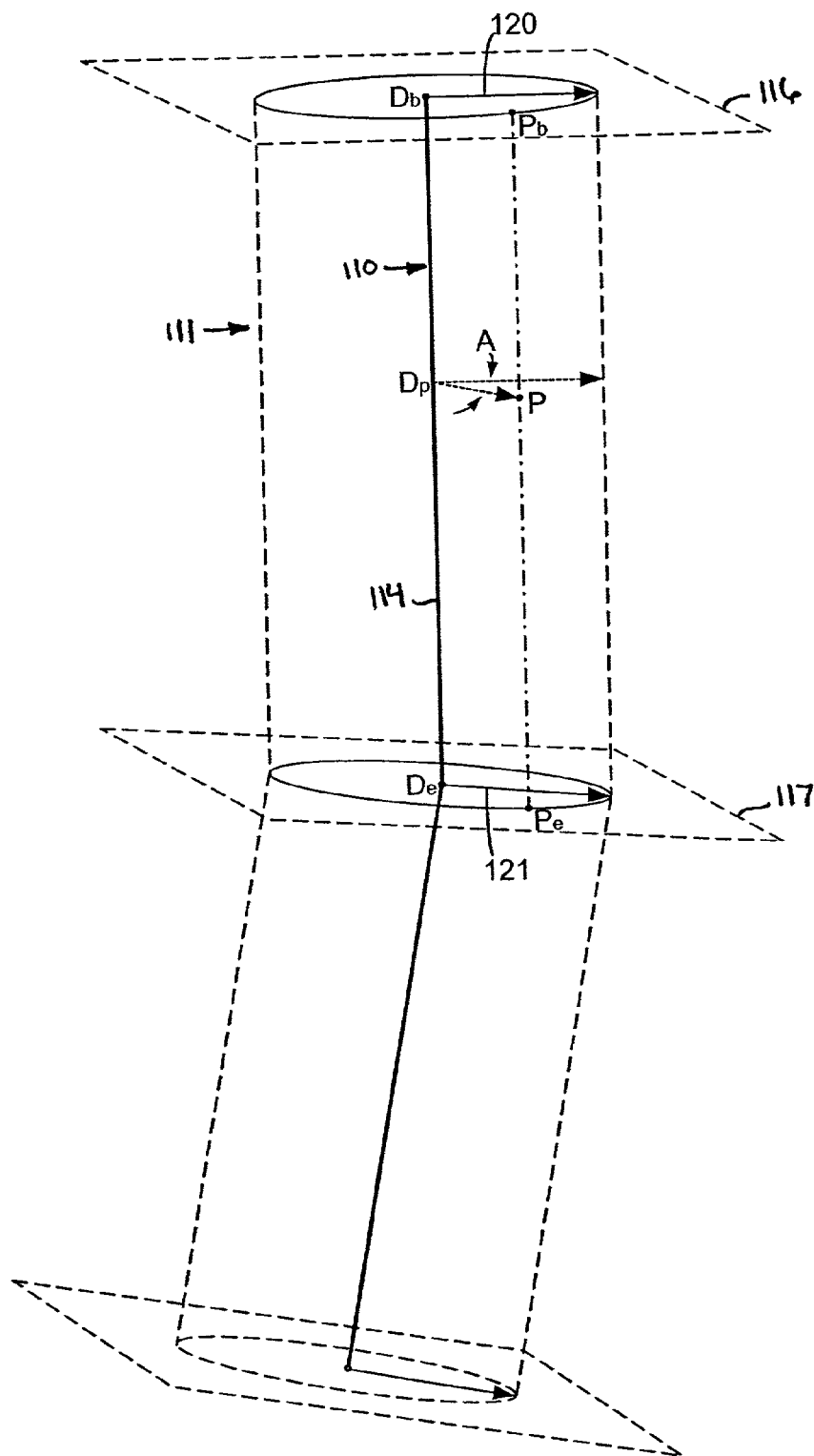
FIG. 13 is a diagram illustrating a well bore trajectory and the well bore surface defined by the trajectory.

Referring to FIG. 13, a diagram illustrating a well bore trajectory 110 and the well bore surface 111 defined by the trajectory is shown. A segment trajectory 114 has a beginning depth $D_b$ and an ending depth $D_e$. For a given point P in the well bore, the point is first projected onto the bisecting (or terminating) planes 116, 117 at the ends of the segment. The projection at the beginning of the segment can be indicated by $P_b$ and the projection at the end of the segment can be indicated by $P_e$. The distance between these two projections of the point is then mapped onto the distance between the beginning and ending depths of the trajectory. In other words, the measured depth at point P ($D_p$) can be calculated as $D_p=D_b+(P-P_b)\times(D_e-D_b)/(P_e-P_b)$. Thus, effectively, the depth along the well bore trajectory is "stretched"

along the outside of curves in the trajectory and "compressed" along the inside of curves in the trajectory.

It should also be noted that the normal vector for a segment may become ill-defined if it is not translated from one segment to another. For example, the trajectory of the well bore may curve so that the trajectory is parallel to the original normal vector. Consequently, the normal vector for each segment of the trajectory is defined as follows. First, at the beginning of the well bore, a normal vector 120 is defined. This vector extends in an arbitrary direction from the well bore trajectory. The normal vector is then projected onto the bisecting plane 117 at the end of the initial segment of the well bore. The projected vector 121 is then carried through to the next segment of the trajectory and made normal to the trajectory in that segment. This process is repeated from segment to segment throughout the well bore. The angular coordinate A of a point in any of the segments can then be measured from the normal vector in the respective segment.

The radial distance from the well bore path is calculated in a straightforward manner—it is simply the closest distance from the trajectory of the segment.

In one embodiment, each node near the well bore is converted to the well bore coordinate system, and the converted coordinates are stored with the node. Thus, the coordinate transformation is performed only once, and the coordinates of each node are available in the original and transformed coordinate systems.

In the foregoing manner, a well bore having an arbitrary path defined by the trajectory F(x,y,z) and radius r can be characterized in a convenient mathematical form. The nodes of the finite element mesh in the vicinity of the well bore can also be characterized using this same local coordinate system. This facilitates identification of the intersections between the well bore surface and the elements of the mesh. Once the points of intersection between the elements' edges and the well bore surface are identified, the elements are refined as described above. In this manner, an arbitrary-path well bore can be accurately modeled in an unstructured finite element mesh.

Another application of the adaptive meshing methods described above involves the refinement of a finite element mesh to increase the accuracy of a solution for the mesh. In this application, the mesh may not be intersected by a particular plane which defines the points at which the finite element mesh needs to be refined. Instead, a general area in which refinement is required may be identified, and elements within this area may be appropriately subdivided.

One embodiment of this application comprises a method wherein a finite element mesh made up of simplex elements is constructed, and a solution is calculated for the mesh. Portions of the mesh for which the solution has large gradients (i.e., those for which the solution changes rapidly) are then identified. Simplices in the high-gradient portions of the mesh are marked for refinement. This marking may comprise the identification of simplex edges, defining new nodes on these edges (typically around the midpoint of each edge,) and subdividing the corresponding simplex elements as though the elements were intersected at the point of the new node and the opposite edge. After the elements are subdivided (i.e. the mesh is refined,) a new solution is calculated for the finite element mesh. This process may be repeated as necessary to obtain the desired level of accuracy (number of data points) in the high-gradient areas. The addition of simplices only in the high-gradient areas increases the accuracy of the solution without unreasonably increasing the computational requirements of the mesh (as would be the case if the entire mesh were made more fine.)

It should be noted that, just as the simplex elements of the mesh can be refined to include additional nodes in high-gradient areas, the mesh can be modified to remove unnecessary nodes in low-gradient areas. The simplex elements which are associated with the removed nodes are collapsed into a smaller number of elements. This reduces the processing power required to generate a solution for the mesh. The computational requirements of the application can also be reduced by implementing table-driven algorithms to collapse the simplices into a smaller number of elements. (The use of table-driven algorithms also reduces the computational complexity in the case of refining a simplex into a plurality of elements.) The refinement or coarsening of simplices may be limited to preselected regions of the mesh, if it can be determined that certain areas need not be modified (e.g., they are not of particular interest.)

In an application which is configured to collapse simplices within the mesh, it may be desirable to employ a mechanism to prevent certain nodes from being eliminated. For example, certain nodes may correspond to the features of the topology of the modeled system (e.g., known geological surface features within an oil reservoir.) In order to maintain the topology of the modeled system, the corresponding nodes may be designated as invariant, so that they will not be removed or "optimized away."

While the present invention has been described with reference to particular embodiments, it should be understood that the embodiments are illustrative and that the scope of the invention is not limited to these embodiments. Many variations, modifications, additions and improvements to the embodiments described above are possible. Particularly, these variations may include computer readable media (such as floppy disks, CD-ROMs, DVD-ROMs, etc.,) storage devices, computer memories and the like which contain software, firmware or other programming embodying the foregoing methods. It is contemplated that these variations, modifications, additions and improvements fall within the scope of the invention as detailed within the following claims.

What is claimed is:

1. A computor-implemented method of representing a reservoir, the method comprising:
    constructing an n-dimensional finite element mesh corresponding to a geological topology of the reservoir, the n-dimensional finite element mesh having a plurality of n-dimensional simplices;
    generating a first representation of the reservoir based on the n-dimensional finite element mesh to identify a subset of the plurality of n-dimensional simplices; and
    modifying the identified subset of the plurality of n-dimensional simplices to adapt the n-dimensional finite element mesh to generate a second representation of the reservoir.

2. The method of claim 1 wherein modifying the identified subset of the plurality of n-dimensional simplices comprises subdividing each of the simplices in the identified subset into a plurality of new simplices.

3. The method of claim 1 wherein modifying the identified subset of the plurality of n-dimensional simplices comprises collapsing each of the simplices in the identified subset.

4. The method of claim 3 wherein each of the simplices has a plurality of nodes and a plurality of edges connecting the nodes, wherein at least one of the nodes is invariant and wherein collapsing each of the simplices in the identified subset comprises removing one or more of the nodes, preventing removal of the invariant nodes, and forming simplices based upon the remaining nodes.

5. The method of claim 1 wherein the subset of the plurality of n-dimensional simplices corresponds to a region having a high gradient.

6. The method of claim 5 wherein generating the representation of the reservoir based on the n-dimensional finite element mesh to identify the subset of the plurality of n-dimensional simplices corresponding to the region having the high gradient is repeated one or more times.

7. The method of claim 1 wherein n=3.

8. The method of claim 7 wherein each of the n-dimensional simplices in the identified subset of the plurality of n-dimensional simplices is intersected by a 2-dimensional surface.

9. The method of claim 8 wherein the two-dimensional surface intersects at least one edge of each of the n-dimensional simplices in the identified subset of the plurality of n-dimensional simplices.

10. The method of claim 1 wherein n=4.

11. The method of claim 10 wherein the four dimensions of the mesh correspond to three spatial dimensions and one temporal dimension.

12. The method of claim 1 wherein each of the n-dimensional simplices has a plurality of nodes and a plurality of edges connecting the nodes and wherein the method further comprises providing a definition of a surface within a region modeled by the n-dimensional finite element mesh, identifying intersections between the edges of the n-dimensional simplices and the surface, defining a new node at each of the identified intersections, and defining at least two new n-dimensional simplices incorporating the new nodes.

13. A computer-readable medium containing a plurality of instructions embodying the method, which when executed, performs the steps comprising:
    constructing an n-dimensional finite element mesh corresponding to a geological topology of a reservoir, the n-dimensional finite element mesh having a plurality of n-dimensional simplices;
    generating a first representation of the reservoir based on the n-dimensional finite element mesh to identify a subset of the plurality of n-dimensional simplices; and
    modifying the identified subset of the plurality of n-dimensional simplices to adapt the n-dimensional finite element mesh to generate a second representation of the reservoir.

14. The computer-readable medium of claim 13 wherein modifying the identified subset of the plurality of n-dimensional simplices comprises subdividing each of the simplices in the identified subset into a plurality of new simplices.

15. The computer-readable medium of claim 13 wherein modifying the identified subset of the plurality of n-dimensional simplices comprises collapsing each of the simplices in the identified subset.

16. The computer-readable medium of claim 15 wherein a portion of the mesh is held invariant during the collapsing of the simplices in the identified subset.

17. The computer-readable medium of claim 13 wherein the subset of the plurality of n-dimensional simplices corresponds to a region having a high gradient.

18. The computer-readable medium of claim 17 wherein generating the representation of the reservoir based on the n-dimensional finite element mesh to identify the subset of the plurality of n-dimensional simplices corresponding to the region having the high gradient is repeated one or more times.

19. The computer-readable medium of claim 13 wherein n=3.

20. The computer-readable medium of claim 19 wherein each of the n-dimensional simplices in the identified subset of the plurality of n-dimensional simplices is intersected by a 2-dimensional surface.

21. The computer-readable medium of claim 13 wherein n=4.

22. A computer-readable medium containing four dimensional finite element mesh data operable by a processor to represent a geological reservoir, wherein the geological reservoir is represented by an unstructured four dimensional finite element mesh including a plurality of four dimensional simplices, the four dimensions of the four dimensional finite element mesh corresponding to three spatial dimensions and one temporal dimension, a subset of the four dimensional simplices corresponding to a three dimensional surface associated with a high gradient wherein one of the dimensions of the three dimensional surface is the temporal dimension, each four dimensional simplex of the subset of the four dimensional simplices including at least one node on the three dimensional surface.

23. The computer-readable medium of claim 22, wherein the unstructured four dimensional finite element mesh further includes a low gradient region.

* * * * *